(12) United States Patent
Huffman et al.

(10) Patent No.: US 6,191,883 B1
(45) Date of Patent: Feb. 20, 2001

(54) FIVE TRANSISTOR SRAM CELL FOR SMALL MICROMIRROR ELEMENTS

(75) Inventors: James D. Huffman, Richardson, TX (US); Rodney D. Miller, Kernersville, NC (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/470,719

(22) Filed: Dec. 23, 1999

Related U.S. Application Data
(60) Provisional application No. 60/114,193, filed on Dec. 30, 1998.

(51) Int. Cl.[7] .................................................... G02B 26/00
(52) U.S. Cl. .......................... 359/291; 359/290; 359/295; 359/223; 359/248; 345/84; 345/85
(58) Field of Search .................................... 359/290, 291, 359/295, 223, 224, 248, 245; 342/21, 27; 345/84, 85; 324/765, 763; 395/281, 555

(56) References Cited

U.S. PATENT DOCUMENTS

| 5,411,769 | 5/1995 | Hornback | 427/534 |
|---|---|---|---|
| 5,583,688 | 12/1996 | Hornback | 359/291 |
| 5,670,976 | * 9/1997 | Chiu et al. | 345/84 |
| 5,745,281 | * 4/1998 | Yi et al. | 359/290 |
| 5,828,485 | * 10/1998 | Hewlett | 359/291 |
| 5,953,151 | * 9/1999 | Hewlett | 359/291 |
| 6,046,840 | * 4/2000 | Huibers | 359/291 |
| 6,049,317 | * 4/2000 | Thompson et al. | 345/85 |

* cited by examiner

Primary Examiner—Loha Ben
(74) Attorney, Agent, or Firm—Charles A. Brill; Wade James Brady, III; Frederick J. Telecky, Jr.

(57) ABSTRACT

An improved memory cell (300) for use in applications, such as micromirror arrays, in which little space is available and a slow read-back cycle is tolerated. The memory (300) comprises a first input/output node (314) connected to the input of a first inverter and to the output of a second inverter. The first inverter is comprised of two transistors (304, 306) and drives a signal to a second input/output node (316). The input of the second inverter is connected to the second input/output node (316). When used to drive a typical micromirror cell, the address electrode of the micromirror cell are electrically connected to the first input/output node (314) and the second input/output node (316).

12 Claims, 4 Drawing Sheets

FIVE TRANSISTOR SRAM CELL FOR SMALL MICROMIRROR ELEMENTS

CROSS-REFERENCE TO RELATED APPLICATIONS

This application claims priority under 35 USC § 119(e)(1) of provisional application No. 60/114,193 filed Dec. 30, 1998.

The following patents and/or commonly assigned patent applications are hereby incorporated herein by reference:

| U.S. Pat. No. | Filing Date | Issue Date | Title |
| --- | --- | --- | --- |
| 5,411,769 | Sept. 29, 1993 | May 2, 1995 | Method of producing Micromechanical Devices |
| 5,583,688 | Dec. 21, 1993 | Dec. 10, 1996 | Multi-Level Digital Micromirror Device |

FIELD OF THE INVENTION

This invention relates to the field of micromirror devices, more particularly to memory cell configurations suitable for use with micromirror devices in high-illumination environments.

BACKGROUND OF THE INVENTION

Micromechanical devices are small structures typically fabricated on a semiconductor wafer using techniques such as optical lithography, doping, metal sputtering, oxide deposition, and plasma etching which have been developed for the fabrication of integrated circuits.

A digital micromirror device (DMD™), sometimes referred to as deformable micromirror device, is a type of micromechanical device. Other types of micromechanical devices include accelerometers, pressure and flow sensors, gears and motors. While some micromechanical devices, such as pressure sensors, flow sensors, and DMDs have found commercial success, other types have not yet been commercially viable.

Digital micromirror devices are primarily used in optical display systems. In display systems, the DMD is a light modulator that uses digital image data to modulate a beam of light by selectively reflecting portions of the beam of light to a display screen. While analog modes of operation are possible, DMDs typically operate in a digital bistable mode of operation and as such are the core of the first true digital full-color image projection systems.

Micromirrors have evolved rapidly over the past ten to fifteen years. Early devices used a deformable reflective membrane which, when electrostatically attracted to an underlying address electrode, dimpled toward the address electrode. Schlieren optics were used to illuminate the membrane and create an image from the light scattered by the dimpled portions of the membrane. Schlieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Torsion beam devices use a thin metal layer to form a torsion beam, which is referred to as a hinge, and a thicker metal layer to form a rigid member, or beam, typically having a mirror-like surface: concentrating the deformation on a relatively small portion of the DMD surface. The rigid mirror remains flat while the hinges deform, minimizing the amount of light scattered by the device and improving the contrast ratio of the device.

Recent micromirror configurations, called hidden-hinge designs, further improve the image contrast ratio by fabricating the mirror on a pedestal above the torsion beams. The elevated mirror covers the torsion beams, torsion beam supports, and a rigid yoke connecting the torsion beams and mirror support, further improving the contrast ratio of images produced by the device.

Consumer display applications have also been evolving as consumers have come to expect increasing image resolution and quality. For example, business projectors will soon be expected to have $\mu$XGA image resolution, that is be able to produce images resolutions of 1024 ×768 pixels. Micromirror-based display systems are difficult to scale to higher resolutions since more elements must be added to the micromirror array. For example, increasing the number of elements in the array increases the size of the device—thereby lowering the number of devices fabricated on a single semiconductor wafer and increasing the size of the projection optics.

While enlarging the size of the array entails several disadvantages, it is also difficult to reduce the size of the modulator elements in order to add elements to the array. The micromirror elements are micromechanical machines that cannot easily be scaled. Furthermore, the semiconductor substrate underneath the micromirrors is filled by a memory array that holds data for each micromirror. The existing memory cells cannot be reduced enough to fit under significantly reduced micromirrors without violating the minimum design rules governing the silicon processing of the SRAM cell. What is needed is a new memory design to support the fabrication of smaller micromirrors that provide less space to fabricate the memory cell.

SUMMARY OF THE INVENTION

Objects and advantages will be obvious, and will in part appear hereinafter and will be accomplished by the present invention which provides a very small static random access memory, and a display system utilizing the improved SRAM cell. According to one embodiment of the disclosed invention, a micromirror element is provided. The micromirror element comprises a semiconductor substrate, at least one memory cell form in the substrate, at least one address electrode connected to the memory cell, and at least one deflectable mirror supported by the substrate. The memory cell comprises: a first and second input/output node; and a first and second inverter. Each input/output node is electrically connected to the input of one inverter and the output of the other inverter. The address electrode is electrically connected to one of the input/output nodes. The deflectable member deflects when electrostatically attracted to the address electrode by a voltage differential between the address electrode and the deflectable member.

According to another embodiment of the disclosed invention, a memory cell is provided. The memory is comprised of: a first and second input/output node; and a first and second inverter. Each input/output node is electrically connected to the input of one comparator and the output of the other comparator. The address electrode is electrically connected to one of the input/output nodes. The deflectable member deflects when electrostatically attracted to the address electrode by a voltage differential between the address electrode and the deflectable member.

According to yet another embodiment of the disclosed invention, an image projection system is provided. The image projection system comprises: a light source for providing a beam of light along a light path, a micromirror device on the light path for selectively reflecting portions of the beam of light along a second light path in response to image data signals, a controller for providing image data signals to the micromirror device; and a projection lens on the second light path for focusing the selectively reflected light onto an image plane. The micromirror device comprises: a substrate, at least one memory cell fabricated on the substrate, an address electrode, and a deflectable member. The memory cell is comprised of: a first and second input/output node; and a first and second inverter. Each input/output node is electrically connected to the input of one inverter and the output of the other inverter. The address electrode is electrically connected to one of the input/output nodes. The deflectable member deflects when electrostatically attracted to the address electrode by a voltage differential between the address electrode and the deflectable member.

The primary advantage of the disclosed SRAM cell is its extremely compact layout. Because the entire SRAM cell, including the write transistor, only requires five transistors and two inputs—a word line and a bitline—the new SRAM cell is able to fit underneath a 13.8 µm micromirror cell. Prior DMD SRAM cells used six transistors and three inputs—a word line and a complementary pair of bitlines. The disadvantages of the five-transistor design—the difficulty writing to and reading from the memory cell—are overcome by a series of design and operating mode changes. The changes include mismatched gates on the inverter transistors to lower the latch point of the inverter, lowering the inverter supplies during the write operation, increasing the write enable signal applied to a write pass transistor, and the use of a pre-charge voltage on the bitline prior to writing to the memory cell.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
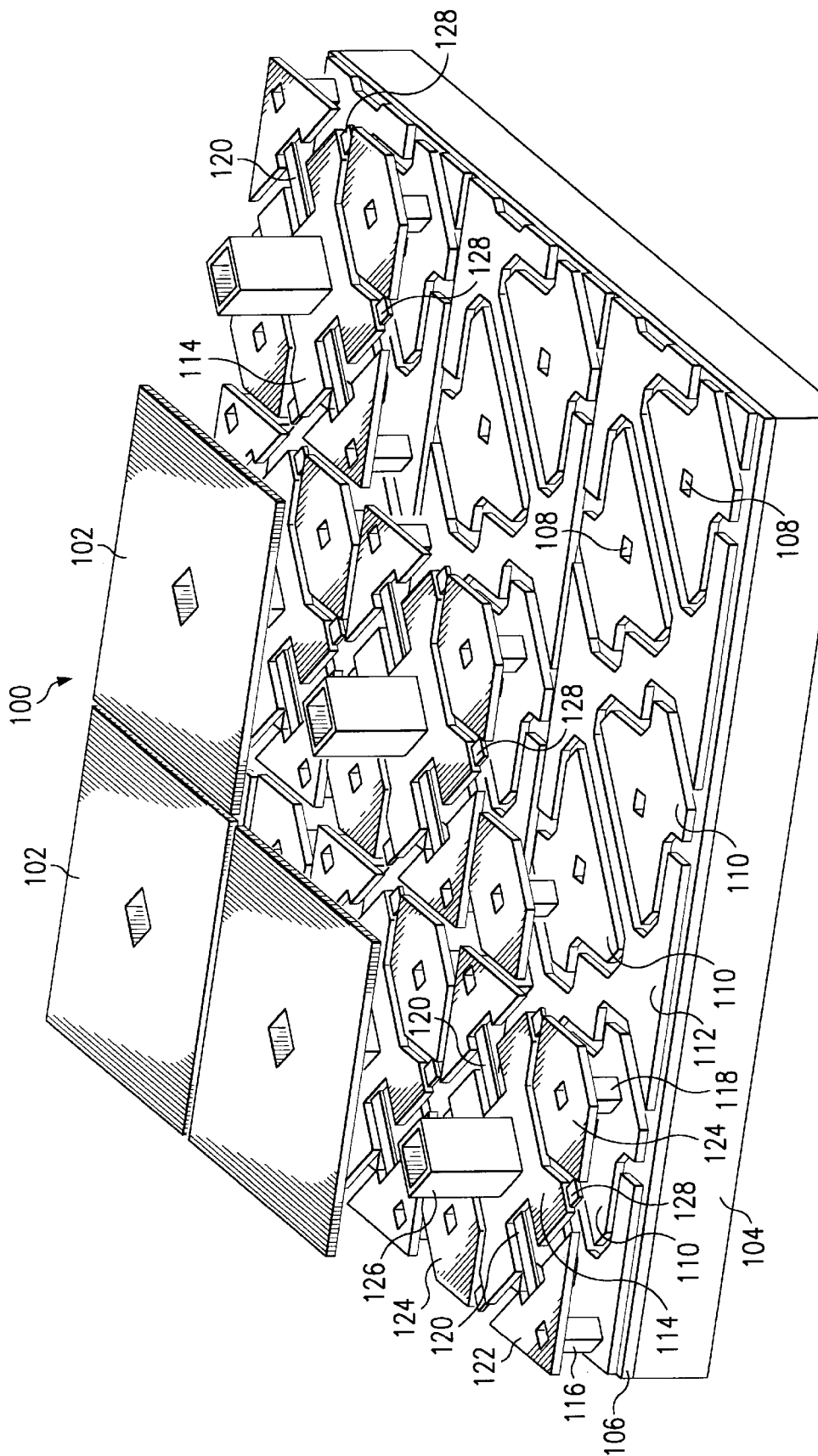
FIG. 1 is a perspective view of a small portion of a prior art digital micromirror array.
Figure 2:
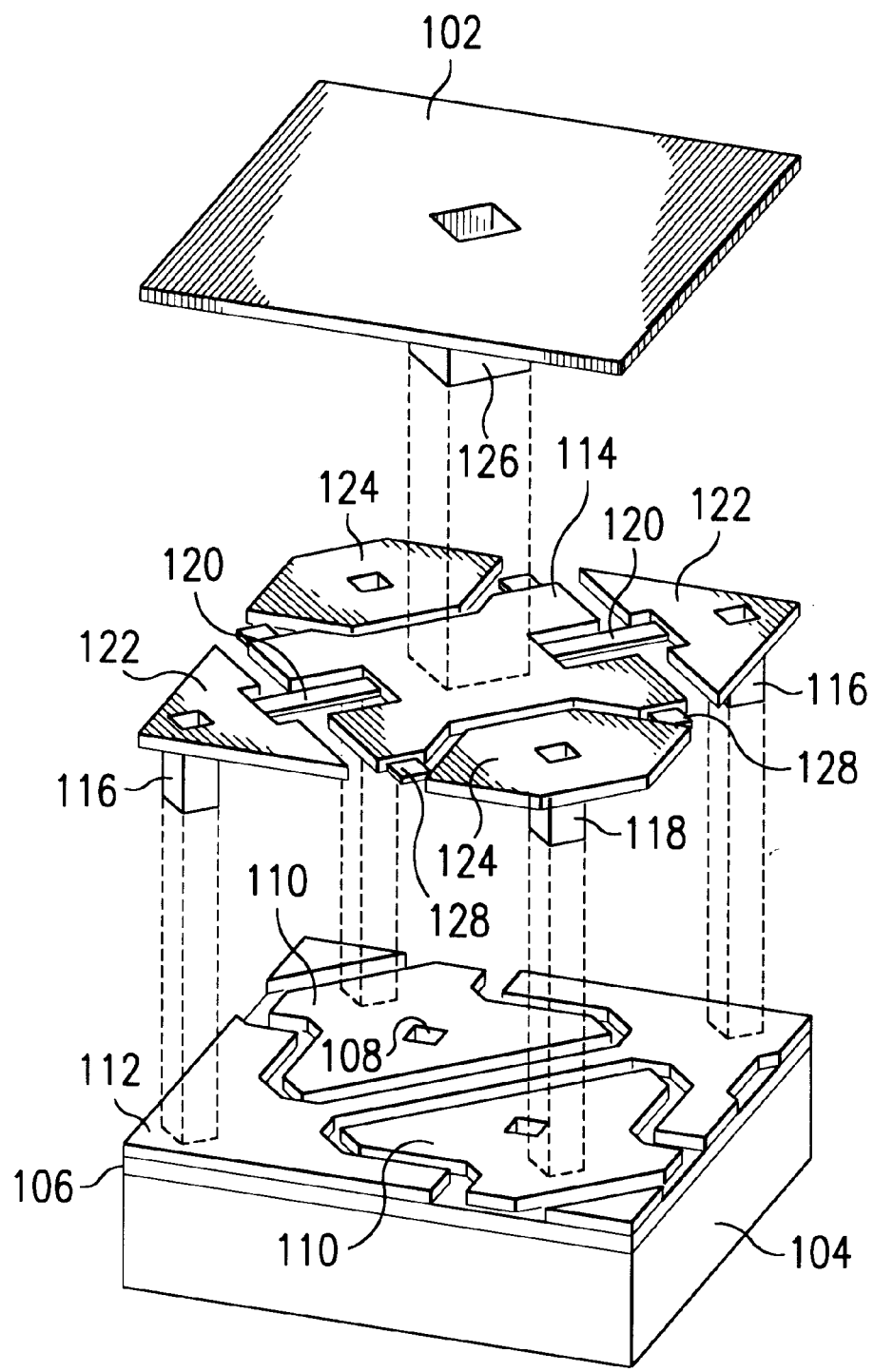
FIG. 2 is an exploded view of one element of the DMD array of FIG. 1.

A typical hidden-hinge DMD 100 is actually an orthogonal array of DMD cells, or elements. This array often includes more than a thousand DMD rows and columns of DMDs. FIG. 1 shows a small portion of a DMD array of the prior art with several mirrors 102 removed to show the underlying mechanical structure of the DMD array. FIG. 2 is an exploded view of a single DMD element of the prior art further detailing the relationships between the DMD structures.

A DMD is fabricated on a semiconductor, typically silicon, substrate 104. Electrical control circuitry is typically fabricated in or on the surface of the semiconductor substrate 104 using standard integrated circuit process flows. This circuitry typically includes, but is not limited to, a memory cell associated with, and typically underlying, each mirror 102 and digital logic circuits to control the transfer of the digital image data to the underlying memory cells. Voltage driver circuits to drive bias and reset signals to the mirror superstructure may also be fabricated on the DMD substrate, or may be external to the DMD. Image processing and formatting logic is also formed in the substrate 104 of some designs. For the purposes of this disclosure, addressing circuitry is considered to include any circuitry, including direct voltage connections and shared memory cells, used to control the direction of rotation of a DMD mirror.

Some DMD configurations use a split reset configuration which allows several DMD elements to share one memory cell-thus reducing the number of memory cells necessary to operate a very large array, and making more room available for voltage driver and image processing circuitry on the DMD integrated circuit. Split reset is enabled by the bistable operation of a DMD, which allows the contents of the underlying memory to change without affecting the position of the mirror 102 when the mirror has a bias voltage applied.

The silicon substrate 104 and any necessary metal interconnection layers are isolated from the DMD superstructure by an insulating layer 106 which is typically a deposited silicon dioxide layer on which the DMD superstructure is formed. Holes, or vias, are opened in the oxide layer to allow electrical connection of the DMD superstructure with the electronic circuitry formed in the substrate 104.

The first layer of the superstructure is a metalization layer, typically the third metalization layer and therefore often called M3. The first two metalization layers are typically required to interconnect the circuitry fabricated on the substrate. The third metalization layer is deposited on the insulating layer and patterned to form address electrodes 110 and a mirror bias connection 112. Some micromirror designs have landing electrodes which are separate and distinct structures but are electrically connects to the mirror bias connection 112. Landing electrodes limit the rotation of the mirror 102 and prevent the rotated mirror 102 or hinge yoke 114 from touching the address electrodes 110, which have a voltage potential relative to the mirror 102. If the mirror 102 contacts the address electrodes 110, the resulting short circuit could fuse the torsion hinges 116 or weld the mirror 102 to the address electrodes 110, in either case ruining the DMD.

Since the same voltage is always applied both to the landing electrodes and the mirrors 102, the mirror bias connection and the landing electrodes are preferably combined in a single structure when possible. The landing electrodes are combined with the mirror bias connection 112 by including regions on the mirror bias/reset connection 112, called landing sites, which mechanically limit the rotation of the mirror 102 by contacting either the mirror 102 or the torsion hinge yoke 114. These landing sites are often coated with a material chosen to reduce the tendency of the mirror 102 and torsion hinge yoke 114 to stick to the landing site.

Mirror bias/reset voltages travel to each mirror 102 through a combination of paths using both the mirror bias/reset metalization 112 and the mirrors and torsion beams of adjacent mirror elements. Split reset designs require the array of mirrors to be subdivided into multiple subarrays each having an independent mirror bias connection. The landing electrode/mirror bias 112 configuration shown in FIG. 1 is ideally suited to split reset applications since the DMD elements are easily segregated into electrically isolated rows or columns simply by isolating the mirror bias/reset layer between the subarrays. The mirror bias/reset layer of FIG. 1 is shown divided into rows of isolated elements.

A first layer of supports, typically called spacervias, is fabricated on the metal layer forming the address electrodes 110 and mirror bias connections 112. These spacervias, which include both hinge support spacervias 116 and upper address electrode spacervias 118, are typically formed by spinning a thin spacer layer over the address electrodes 110 and mirror bias connections 112. This thin spacer layer is typically a 1 μm thick layer of positive photoresist. After the photoresist layer is deposited, it is exposed, patterned, and deep UV hardened to form holes in which the spacervias will be formed. This spacer layer and a thicker spacer layer used later in the fabrication process are often called sacrificial layers since they are used only as forms during the fabrication process and are removed from the device prior to device operation.

A thin layer of metal is sputtered onto the spacer layer and into the holes. An oxide is then deposited over the thin metal layer and patterned to form an etch mask over the regions that later will form hinges 120. A thicker layer of metal, typically an aluminum alloy, is sputtered over the thin layer and oxide etch masks. Another layer of oxide is deposited and patterned to define the hinge yoke 114, hinge cap 122, and the upper address electrodes 124. After this second oxide layer is patterned, the two metals layers are etched simultaneously and the oxide etch stops removed to leave thick rigid hinge yokes 114, hinge caps 122, and upper address electrodes 124, and thin flexible torsion beams 120.

A thick spacer layer is then deposited over the thick metal layer and patterned to define holes in which mirror support spacervias 126 will be formed. The thick spacer layer is typically a 2 μm thick layer of positive photoresist. A layer of mirror metal, typically an aluminum alloy, is sputtered on the surface of the thick spacer layer and into the holes in the thick spacer layer. This metal layer is then patterned to form the mirrors 102 and both spacer layers are removed using a plasma etch.

Once the two spacer layers have been removed, the mirror is free to rotate about the axis formed by the torsion hinge. Electrostatic attraction between an address electrode 110 and a deflectable rigid member, which in effect form the two plates of an air gap capacitor, is used to rotate the mirror structure. Depending on the design of the micromirror device, the deflectable rigid member is the torsion beam yoke 114, the beam or mirror 102, a beam attached directly to the torsion hinges, or a combination thereof. The upper address electrodes 124 also electrostatically attract the deflectable rigid member.

The force created by the voltage potential is a function of the reciprocal of the distance between the two plates. As the rigid member rotates due to the electrostatic torque, the torsion beam hinges resist deformation with a restoring torque which is an approximately linear function of the angular deflection of the torsion beams. The structure rotates until the restoring torsion beam torque equals the electrostatic torque or until the rotation is mechanically blocked by contact between the rotating structure and a fixed component. As discussed below, most micromirror devices are operated in a digital mode wherein sufficiently large bias voltages are used to ensure full deflection of the micromirror superstructure.

Micromirror devices are generally operated in one of two modes of operation. The first mode of operation is an analog mode, sometimes called beam steering, wherein the address electrode is charged to a voltage corresponding to the desired deflection of the mirror. Light striking the micromirror device is reflected by the mirror at an angle determined by the deflection of the mirror. Depending on the voltage applied to the address electrode, the cone of light reflected by an individual mirror is directed to fall outside the aperture of a projection lens, partially within the aperture, or completely within the aperture of the lens. The reflected light is focused by the lens onto an image plane, with each individual mirror corresponding to a fixed location on the image plane. As the cone of reflected light is moved from completely within the aperture to completely outside the aperture, the image location corresponding to the mirror dims, creating continuous brightness levels.

The second mode of operation is a digital mode. When operated digitally, each micromirror is fully deflected in either of the two directions about the torsion beam axis. Digital operation uses a relatively large voltage to ensure the mirror is fully deflected. Since it is advantageous to drive the address electrode using standard logic voltage levels, a bias voltage, typically a negative voltage, is applied to the mirror metal layer to increase the voltage difference between the address electrodes and the mirrors. Use of a sufficiently large mirror bias voltage—a voltage above what is termed the collapse voltage of the device—ensures the mirror will deflect to the closest landing electrodes even in the absence of an address voltage. Therefore, by using a large mirror bias voltage, the address voltages need only be large enough to deflect the mirror slightly.

To create an image using the micromirror device, the light source is positioned at an angle equal to twice the angle of rotation so that mirrors rotated toward the light source reflect light in a direction normal to the surface of the micromirror device and into the aperture of a projection lens—creating a bright pixel on the image plane. Mirrors rotated away from the light source reflect light away from the projection lens—leaving the corresponding pixel dark. Intermediate brightness levels are created by pulse width modulation techniques in which the mirror is rapidly and repetitively rotated on and off. The duty cycle of the mirror determines the quantity of light reaching the image plane. The human eye integrates the light pulses and the brain perceives a flicker-free intermediate brightness level.

Full-color images are generated by using three micromirror devices to produce three single-color images, or by sequentially forming three single-color images using a single micromirror device illuminated by a beam of light passing through three color filters mounted on a rotating color wheel.

Typical micromirror devices use a six-transistor static random access memory (SRAM) cell for each micromirror element is a reset block. The micromirror elements are 17 μm across, allowing a minimal amount of room on the substrate beneath each micromirror element to fabricate the memory cell.

As mentioned above, the migration to higher resolutions requires additional micromirror cells to be added to the array. Merely adding the additional cells makes the array too large to be economically manufactured. To avoid increasing the size of the array, future micromirror arrays will have smaller micromirror cells. These smaller micromirror cells will not provide enough room to form a six-transistor SRAM under each micromirror cell. Therefore, a smaller memory cell is necessary to enable the reduced micromirror cell sizes. The five transistor design described herein reduces the size of the memory cell without changing the minimum design rules for a given silicon process.

The present invention takes advantage of the realization that micromirror memory arrays are only read from electrically during initial device fabrication and testing—in operation, the data stored in the array manipulates the micromirror. Existing SRAM designs are optimized to provide very fast read times. If the device read time is allowed to increase, it is possible to design an SRAM cell that can fit under a smaller micromirror cell, such as a 13.8 μm micromirror cell.

Figure 3:
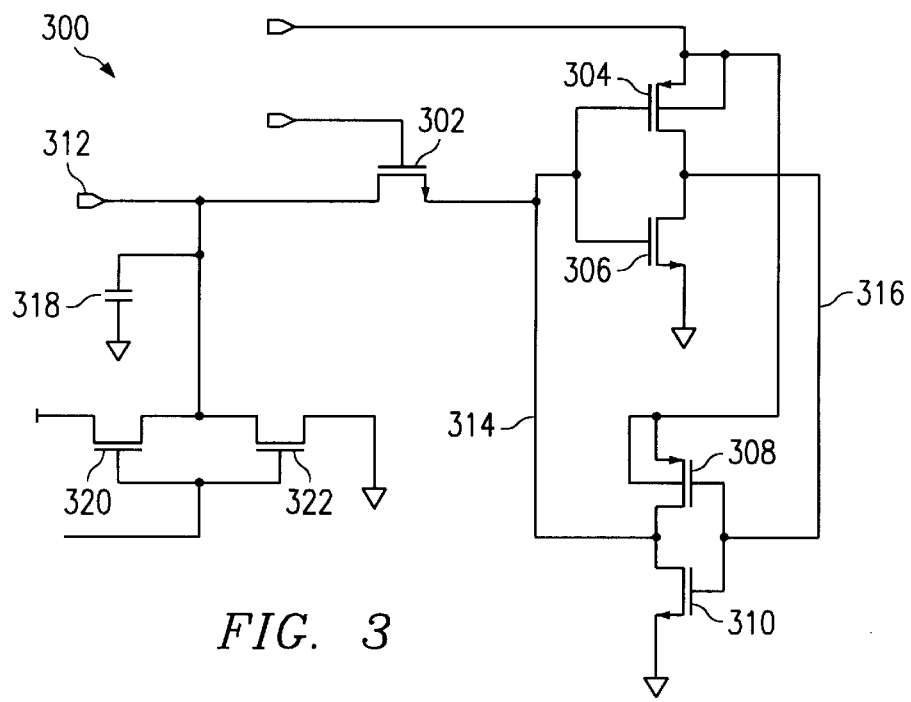
FIG. 3 is a schematic view of a five-transistor SRAM cell according to one embodiment of the disclosed invention that is suitable for use in a micromirror device.

FIG. 3 is a schematic view of the new SRAM cell 300. The SRAM includes five transistors. A write transistor 302 is enabled to allow new data to be written to the SRAM cell 300. A first pair of transistors 304, 306 forms a first inverter. A second pair of transistors 308, 310 forms a second inverter. The output of the first inverter is connected to the input of the second inverter, and the output of the second inverter is connected to the input of the first inverter.

When a logic high signal is present on the input bitline 312 and the write transistor 302 is enabled, the logic high signal reaches signal node 314. The logic high at node 314 is inverted by the first inverter 304, 306 and appears as a logic low on node 316. The logic low on node 316 causes the second inverter to drive a logic high on node 314, ensuring the data written to the cell will remain after the write transistor 302 is disabled.

When fabricated as part of a micromirror cell the two inverter output nodes 314, 316 are connected to the address electrodes to allow the data stored in the SRAM cell to control the deflection of the micromirror.

Typical SRAM cells include two write transistors to allow the cell to be written to, and read from, using the input/output nodes 314, 316 of both transistors. By only using one of the input/output nodes 314, it is much more difficult to read from and write to the SRAM cell. The difficulty writing to the SRAM cell occurs when the data being written to the SRAM cell is attempting to overwrite existing data in the SRAM cell, that is when the binary data written to the cell is different from the data presently stored in the cell. When new data attempts to overwrite existing data in the SRAM cell, the second inverter cell comprised of transistors 308, 310 biases the input node 314 toward one supply line while the input data is trying to pull the input node 314 toward the other supply line.

Several design and operational changes have been made to allow SRAM cell 300 to be overwritten and read from. The first design change is to ensure that the transistor supply voltages are limited during the write operation. The transistor supply voltage determine the voltages of the address electrodes. Since it is necessary for a micromirror device to have relatively high address voltages in order to deflect the micromirror, the timing of the write operation is restricted to a period when the micromirror position is latched and the address voltages can be reduced to 5 volts or less.

Figure 4:
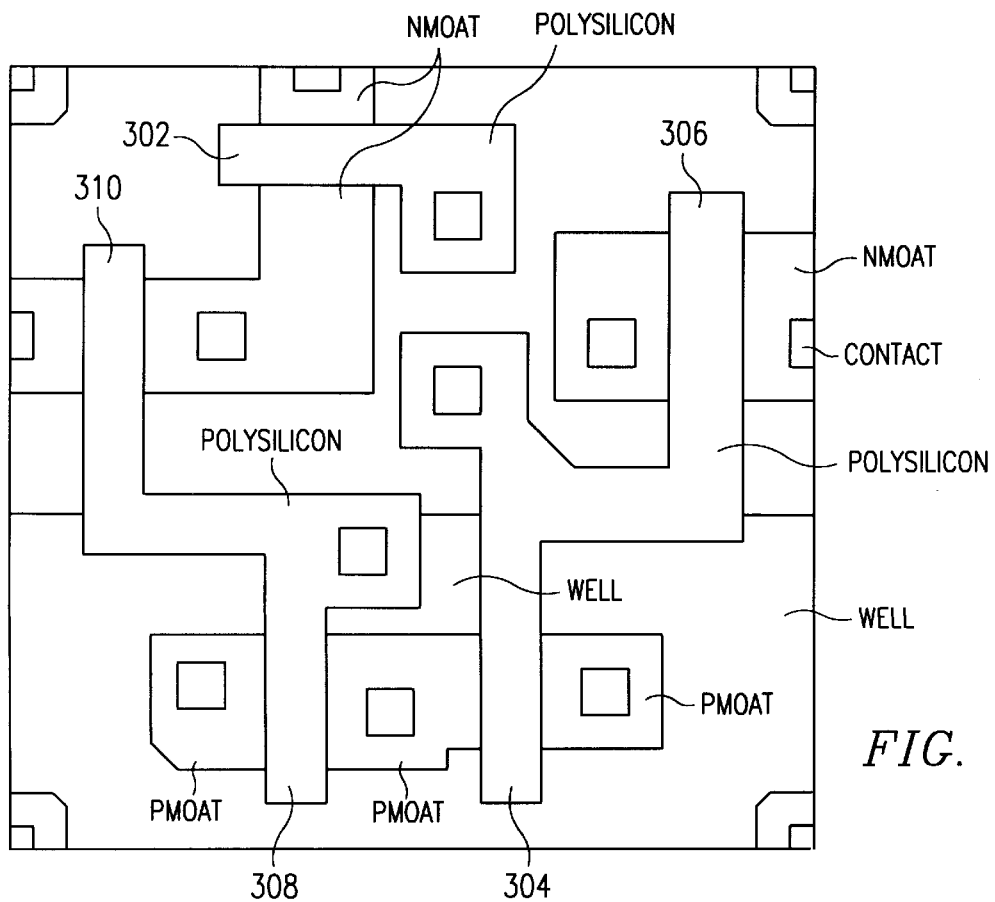
FIG. 4 is a plan view of one possible arrangement of the components of the five-transistor cell.

A second feature that enables the SRAM cell 300 to be written to is the mismatched transistors used for the inverters. FIG. 4 is a plan view of the five-transistor SRAM cell showing one possible layout of the transistors. As shown in FIG. 4, the gate widths of the two transistors making up each of the two inverters are mismatched to lower the trip point of the cell to less than $V_{cc}/2$. Referring back to FIG. 3, lowering the trip point of the inverters makes it easier to write a logic high into the SRAM cell when the second inverter of the SRAM is driving a logic low to the input node 314.

A third change is made to the voltage used to drive the write transistor 302. Due to the $V_T$ loss through the write transistor 302, the gate of the write transistor 302 must be overdriven to allow the write transistor 302 to pass a 5 volt data signal. Therefore, during the write period, the gate of the write transistor is driven to 7.5 volts to minimize the loss through the write transistor 302 and enable the bitline 312 to drive a logic high on the input node 314 of the SRAM cell.

An additional change, the addition of a recharge capacitor and charge circuit to the bitline, also makes it easier to read from the SRAM cell. The pre-charge is used to prevent the SRAM cell 300 from having to overcome the parasitic capacitance of the bitline when the SRAM cell 300 is being read from. A pre-charge cycle immediately before the read cycle enables transistors 320 and 322 to provide a 2.5 volt bias to the bitline 312. The 2.5 volt bias quickly charges the pre-charge capacitor 318, which is typically a 10 pF capacitor.

When the SRAM is being read, the charge stored on the pre-charge capacitor sets the highly capacitive bitline to an intermediate voltage level between the "on" and "off" output voltage levels of the SRAM cell. This allows the transistors to drive a much smaller voltage difference on the bitline. The pre-charge circuit reduces the charging time and provides a more reliable read-back operation from the SRAM cell. A comparator is used to read the bitline and determine if the bitline data is a logic 1 or a logic 0.

Figure 5:
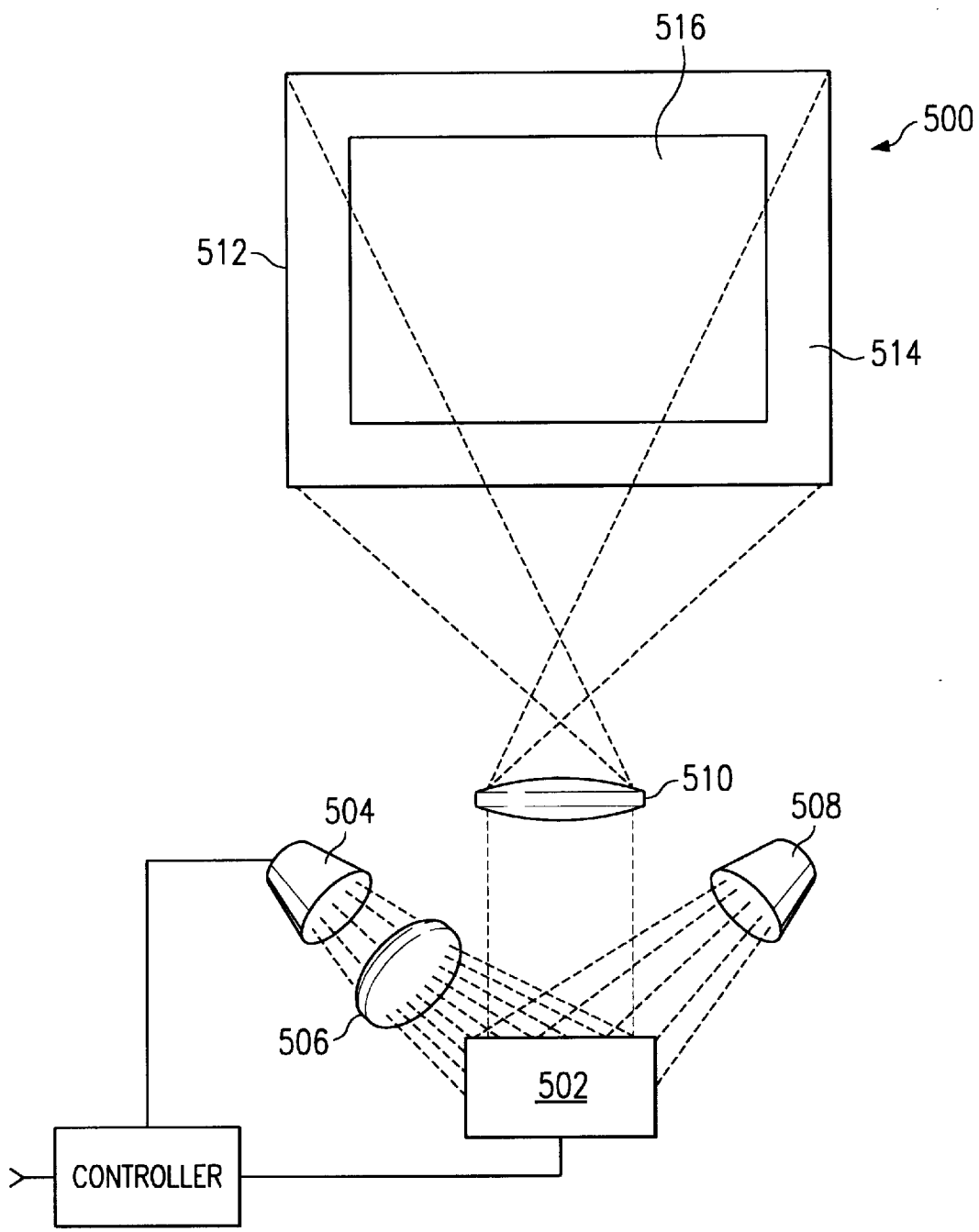
FIG. 5 is a schematic view of a display system using a micromirror device having the improved SRAM cell of FIGS. 3 and 4.

FIG. 5 is a schematic view of an image projection system 500 using an improved micromirror 502 according to the present invention. In FIG. 5, light from light source 504 is focused on the improved micromirror 502 by lens 506. Although shown as a single lens, lens 506 is typically a group of lenses, integrators, and mirrors which together focus and direct light from the light source 504 onto the surface of the micromirror device 502. Image data and control signals from controller 514 is written to the five-transistor SRAM cell under each micromirror. The data in the SRAM cells cause some mirrors to rotate to an on position and others to rotate to an off position. Mirrors on the micromirror device that are rotated to an off position reflect light to a light trap 508 or away from projection lens 510, while mirrors rotated to an on position reflect light to projection lens 510, which is also shown as a single lens for simplicity. Projection lens 510 focuses the light modulated by the micromirror device 502 onto an image plane or screen 512.

Thus, although there has been disclosed to this point a particular embodiment for a five-transistor SRAM cell and micromirror, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. A micromirror device comprising:
   a semiconductor substrate;
   at least one memory cell formed in said substrate, said memory cell comprising:
      a first input/output node;
      a first inverter having an input and an output, said input of said first inverter electrically connected to said first input/output node, said output of said first inverter electrically connected to a second input/output node; and
      a second inverter having an input and an output, said input of said second inverter electrically connected to said second input/output node, said output of said second inverter electrically connected to said first input/output node;
   at least one address electrode, said at least one address electrode electrically connected to one of said first and second input/output nodes;
   at least one deflectable member supported by said semiconductor substrate, said deflectable member operable to deflect when electrostatically attracted to said at least one address electrode by a voltage differential between said address electrode and said deflectable member.

2. The micromirror device of claim 1, further comprising:
   a bitline; and
   a write transistor connecting said bitline to said first input/output node.

3. The micromirror device of claim 2, wherein a 7.5 volt write signal is used to enable said write transistor.

4. The micromirror device of claim 2, further comprising: a pre-charge capacitor electrically connected to said bitline.

5. The micromirror device of claim 4, further comprising:
   a pair of pre-charge transistors, each of said pre-charge transistors connecting said bitline to a supply voltage.

6. The micromirror device of claim 1, each of said first and second inverters comprising two transistors.

7. A memory cell comprising:
   a first input/output node;
   a first inverter having an input and an output, said input of said first inverter electrically connected to said first input/output node, said output of said first inverter electrically connected to a second input/output node; and
   a second inverter having an input and an output, said input of said second inverter electrically connected to said second input/output node, said output of said second inverter electrically connected to said first input/output node;
   at least one address electrode, said at least one address electrode electrically connected to one of said first and second input/output nodes;
   at least one deflectable member supported by a semiconductor substrate, said deflectable member operable to deflect when electrostatically attracted to said at least one address electrode by a voltage differential between said address electrode and said deflectable member.

8. The memory cell of claim 7, further comprising:
   a bitline; and
   a write transistor connecting said bitline to said first input/output node.

9. The memory cell of claim 8, wherein a 7.5 volt write signal is used to enable said write transistor.

10. The memory cell of claim 8, further comprising:
    a pre-charge capacitor electrically connected to said bitline.

11. The micromirror device of claim 10, further comprising:
    a pair of pre-charge transistors, each of said pre-charge transistors connecting said bitline to a supply voltage.

12. A image projection system comprising:
    a light source for providing a beam of light along a light path;
    a micromirror device on said light path for selectively reflecting portions of said beam of light along a second light path in response to image data signals;
    a controller for providing image data signals to said micromirror device; and
    a projection lens on said second light path for focusing said selectively reflected light onto an image plane;
    said micromirror device comprising;
       a semiconductor substrate;
       at least one memory cell fabricated on said semiconductor substrate, said memory cell comprising:
          a first input/output node;
          a first inverter having an input and an output, said input of said first inverter electrically connected to said first input/output node, said output of said first inverter electrically connected to a second input/output node; and
          a second inverter having an input and an output, said input of said second inverter electrically connected to said second input/output node, said output of said second inverter electrically connected to said first input/output node;
       at least one address electrode, said at least one address electrode electrically connected to one of said first and second input/output nodes;
       at least one deflectable member supported by said semiconductor substrate, said deflectable member operable to deflect when electrostatically attracted to said at least one address electrode by a voltage differential between said address electrode and said deflectable member.

* * * * *